United States Patent [19]

Hashimoto et al.

[11] Patent Number: 4,890,262

[45] Date of Patent: Dec. 26, 1989

[54] SEMICONDUCTOR MEMORY WITH BUILT-IN DEFECTIVE BIT RELIEF CIRCUIT

[75] Inventors: Masashi Hashimoto, Ami; Tadashi Tachibana, Tsuchiura, both of Japan

[73] Assignee: Texas Instruments Incorporated, Dallas, Tex.

[21] Appl. No.: 142,969

[22] Filed: Jan. 12, 1988

[30] Foreign Application Priority Data

Jan. 14, 1987 [JP] Japan .................................. 62-7166

[51] Int. Cl.⁴ ........................ G11C 7/00; G11C 29/00
[52] U.S. Cl. .................................... 365/200; 365/236
[58] Field of Search ............... 365/221, 236, 200, 119, 365/222, 189

[56] References Cited

U.S. PATENT DOCUMENTS

| | | | |
|---|---|---|---|
| 3,758,761 | 9/1973 | Henrion | 235/153 |
| 3,993,982 | 11/1976 | Tallent et al. | 365/236 |
| 4,458,357 | 7/1984 | Weymouth et al. | 365/236 |
| 4,737,935 | 4/1988 | Wawersig et al. | 365/200 X |
| 4,748,594 | 5/1988 | Iida | 365/200 X |

FOREIGN PATENT DOCUMENTS 59-16187  1/1984  Japan .................................. 365/236

Primary Examiner—Stuart N. Hecker
Assistant Examiner—Alfonso Garcia
Attorney, Agent, or Firm—William E. Hiller; N. Rhys Merrett; Melvin Sharp

[57] ABSTRACT

A semiconductor memory device which has a memory portion and a counter to count rows and/or columns of the memory portion, the counter being so constructed to return to a reset mode at the beginning of an address counting sequence when coming up to an arbitrary address such that an address or addresses corresponding to a region of the memory containing one or more defective memory cells and occurring after the arbitrary address are inaccessible. The counter thereby comprises a defective bit relief circuit built into the memory device.

7 Claims, 3 Drawing Sheets

SEMICONDUCTOR MEMORY WITH BUILT-IN DEFECTIVE BIT RELIEF CIRCUIT

BACKGROUND OF THE INVENTION

1. Field of the Invention

The present invention relates to a memory device.

2. Description of the Prior Art

In a semiconductor memory such as a RAM (random access memory), so-called redundant memory cell construction is adopted which comprises a built-in defective bit relief circuit. According to this construction, some redundant memory cells in which redundant bits are stored are arranged beforehand in a memory device and defective memory cells containing defective bits are replaced by the above redundant memory cells containing redundant bits to improve the percent production yield of operable memory devices.

However, because a chip area increased by arranging for additional memory cells having such redundant bits, it is inappropriate to provide for a substantial number of additional memory cells having redundant bits as built-in the memory chip from the viewpoint of maintaining miniaturization of the chip and economy. Hence, heretofore, additional memory cells having only 2-4 redundant bits are generally provided in rows and columns of a memory device. Memory devices having more than 2-4 defective memory cells providing defective bits are scrapped as defective goods under present commercial practices.

OBJECTS AND SUMMARY OF THE INVENTION

An object of the present invention is to provide a memory device that can be accommodated on a chip of reduced size and with a cost having through an efficiently built-in defective bit relief circuit that can reduce the percentage of defective memory devices which are produced.

Namely, the present invention provides a memory device which has a memory portion and a counter to count rows and/or columns of the memory portion, wherein the counter returns to a reset mode at the beginning of an address counting sequence when coming up to an arbitrary address and an address or addresses corresponding to a region of the memory containing one or more defective memory cells after the arbitrary address are inaccessible.

Other objects, features and advantages of the invention will appear more fully from the following detailed description taken in connection with the accompanying drawings.

DESCRIPTION OF THE PREFERRED EMBODIMENTS

The preferred embodiments of the invention will be described below.

Figure 1:
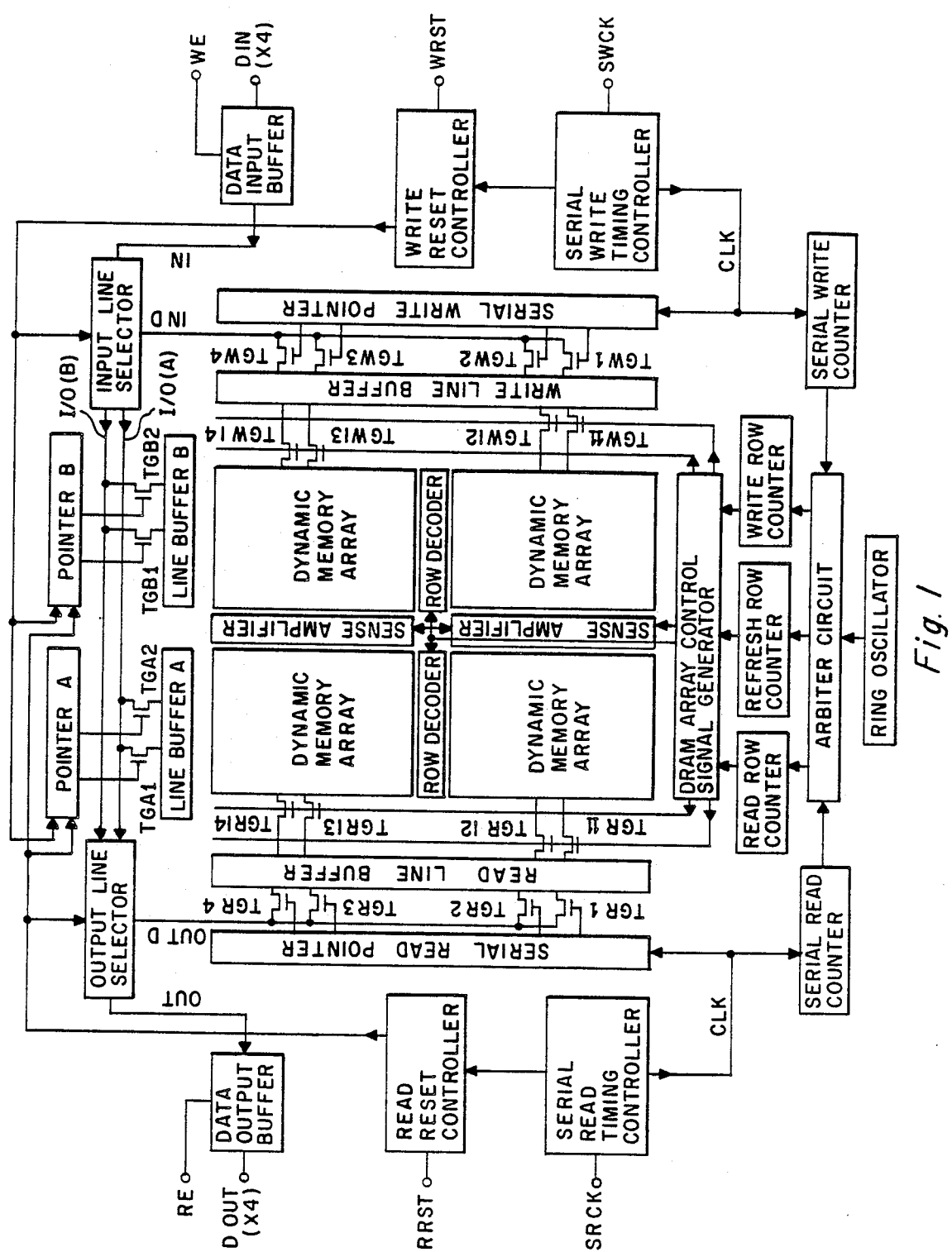
FIG. 1 is a block diagram of a FIFO semiconductor memory device in which the invention may be embodied.

FIG. 1 shows a FIFO (First In First Out) memory as a circuit configuration of a semiconductor memory device in which the present invention may be embodied. This FIFO memory comprises dynamic type memory elements as main memory elements and has the following structural features (1)-(6).

(1) The main memory comprises unitransistor type memory cells as fabricated on the DRAM (Dynamic Random Access Memory) device that allows high circuit integration and production at a rather low cost;

(2) An internal self-control circuit is provided to allow for the refresh and precharge control, for which the user is ordinarily responsible in the operation of a conventional DRAM;

(3) A dedicated write line buffer is provided so that data write cycle time can be freely set in a wide range from low speed ($10^{-4}$ to $10^{-3}$ sec) to high speed operation ($30 \times 10^{-9}$ sec);

(4) A dedicated read line buffer is provided to read data at a cycle time that can be set in the same range as the data write cycle time but without requiring any synchronization with the write line buffer;

(5) An additional static type line buffer or buffers are provided to allow for faster response to the reset (return to head address) signal; and (6) A defective bit relief circuit is provided in accordance with the present invention to improve the percent production yield of operable memory devices.

Especially, in the example, the above defective bit relief circuit is effectively built-in as mentioned below.

Figure 2:
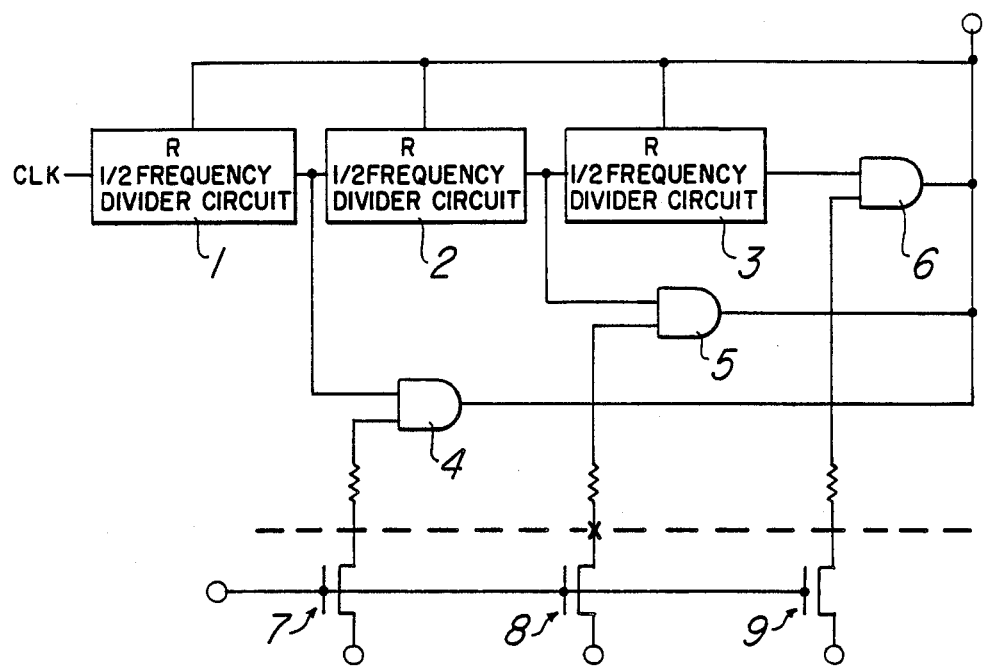
FIG. 2 is a schematic circuit diagram of a serial write or serial read counter which may be employed in the memory device of FIG. 1 in accordance with the present invention.

Namely, a serial read counter and a serial write counter of the memory devices of FIG. 1 each have a defective bit relief function, each of the counters having a built-in circuit constructed as shown in FIG. 2. These counters are primarily so designed as to count internally rows and columns of memory cells included in a memory portion and to be reset to the beginning of a counting sequence, such as "zero", by a reset pulse to increment the count again. The counters are so constructed that they generate a reset pulse to return to zero when reaching a maximum accessible address. (Namely, each counter may increment up to the maximum address at which all of the memory cells in a row or column identified by the address are operable. The region of the memory device in which defective memory cells providing defective bits exist) is identified by an address or addresses which are inaccessible to the respective serial read counter and serial write counter. Each counter upon being reset to zero, is ready again to begin incrementing up to the maximum accessible address.

In the circuit (an encoder) shown in FIG. 2, logic gates in the form of AND circuits 4, 5 and 7 are arranged on each output side of ½ frequency divider circuits 1, 2 and 3 connected in series, and the output side of each AND circuit is connected in a common output line to draw output. Fuse elements 7, 8 and 9 which may comprise MOSFET structures (metal oxide semiconductor field effect transistor) are connected to the other input terminal of each AND circuit, respectively. An AND circuit and a fuse element are selectively disconnected (or a wire therebetween is cut) at a position as shown by a broken line in FIG. 2, corresponding to a region of the memory device having one or more defective memory cells providing defective bits as known previously from testing of the memory portion. For example, a fuse element 8 is cut or disconnected as shown by the X mark in FIG. 2 to program the memory device to avoid use of a memory region containing one or more defective memory cells. In this case, a clock signal CLK (as supplied from a serial read or write timing controller as shown in FIG. 1) is input to the frequency divider circuit 1, and the output of the frequency divider circuit 1 is then input into the next frequency divider circuit 2 and into a first input as the AND circuit 4. The output of the AND circuit 4 is maintained at "0" when the fuse element 7 is connected to a second input of the AND circuit 4 and holds the second input terminal thereof at a "0" level. The frequency divider circuit 2 keeps on operating. An output of the frequency divider circuit 2 is further input into a first input of the AND circuit 5. As shown in FIG. 2, the other input terminal of this AND circuit 5 is at a "1" level because of the disconnection of the fuse element 8 from the second input of the AND circuit 5. Hence, an output "1" is obtained from the AND circuit 5. Namely, the output "1" of the AND circuit 5 provides a reset pulse which is supplied to the frequency divider circuits 1, 2 and 3 simultaneously via a reset feedback line connected to the common output line for the outputs of the AND circuits 4, 5 and 6. As a result, a programming of the memory device is effected so that the count number at the frequency divider circuits 1 and 2 corresponds to the maximum address, and addresses after the maximum address are all inaccessible. Accordingly, it is possible to make effective use of a region containing no defective memory cells, thereby relieving the possibility of including defective bits in the operation of the memory device effectively. In this respect, disconnection of a fuse element from the second input of a corresponding AND circuit can be voluntarily selected so as to correspond to the address of a region of the memory device containing one or more defective memory cells providing defective bits.

As described above, the circuit shown in FIG. 2 can solve the problem of defective bits in the use of a memory device effectively, whereas the redundant construction of memory cells as in memory devices of the prior art may still result in defective bits being included in the data processing operations in spite of adopting redundant memory cells as replacements for defective memory cells. Thus, the counter circuit of FIG. 2 enables one to make use of effective regions of a memory device without scrapping it because of the presence of defective memory cells in other regions. For example, in the case of a 256K-bit RAM containing many defective bits, if 32K bits or more are usable, it may still have value as a memory device, although its effective storage capacity has become rather small. In the latter connection, the defective bit relief circuit in accordance with the present invention can make it possible to use effectively 32K bits or more as an otherwise unusable 256K-bit RAM.

Therefore, a circuit for address programming (namely, the encoder circuit as shown in FIG. 2) is merely added to a memory device to realize an end result of an operable memory device comparable to a redundant memory cell construction very easily, and the size and cost of a chip as so equipped do not increase. Besides, although the memory storage capacity of a memory decreases when the defective bit relief counter circuit is employed to avoid the inclusion of defective memory cells in data storage and propagation procedures, the defective kit relief counter circuit can be used in most cases without problem for a FIFO memory because external addressing is unnecessary and thus modifying of an address control circuit is not required in a FIFO memory operation.

Figure 3:
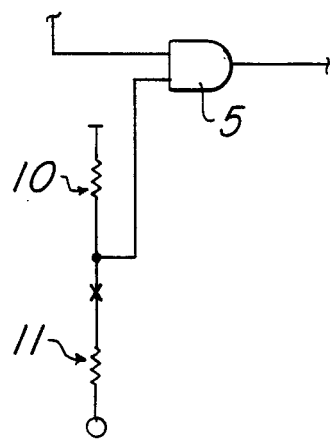
FIG. 3 is a schematic circuit diagram of an embodiment of a fuse element which may be employed in the counter of FIG. 2.

FIG. 3 shows a basic construction of a fuse element which may be employed in the defective bit relief counter circuit of FIG. 2. In FIG. 3, a resistor 10 of high resistance and a resistor 11 of low resistance are connected in series between a power source and ground, and the AND circuit 5 is connected in the middle of these resistors. An input of the AND circuit 5 is "0" through the resistor 11 of low resistance when no programming is involved and the fuse element is connected to the second input of the AND circuit 5, and an input of the AND circuit 5 is "1" when the resistor 11 of the fuse element is disconnected from the second input of the AND circuit 5 as shown by the X mark to program the memory device for avoiding use of defective memory cells.

Next, the operational sequences of the FIFO memory of FIG. 1 will be explained. It is noted that in the present memory device, data read and write ordinarily proceed independently of each other. Such independence will thus be assumed hereinafter unless otherwise stated.

Figure 4:
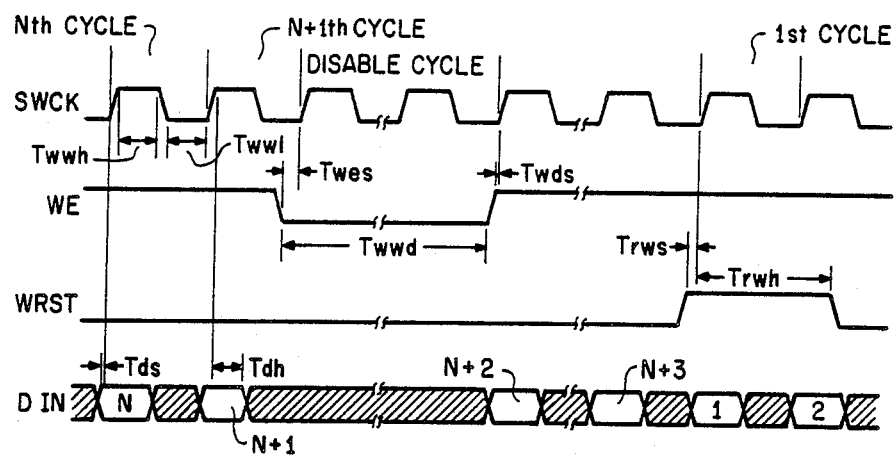
FIG. 4 is a timing chart of signals involved in the write operation of the memory device of FIG. 1.

In the FIFO memory device of FIG. 1, as long as the external input signal WE for data input control is kept high, input data from the data input terminal $D_{IN}$ is written as effective data in the memory device. The write reset signal WRST is an input signal to indicate at the rising edge thereof a return to the beginning address (see FIG. 4) while the clock signal SWCK times the data write cycle.

As long as the external input signal RE for data output control is kept high, data is read out from the data output terminal $D_{OUT}$, under timing control of the serial read clock signal SRCK.

Figure 5:
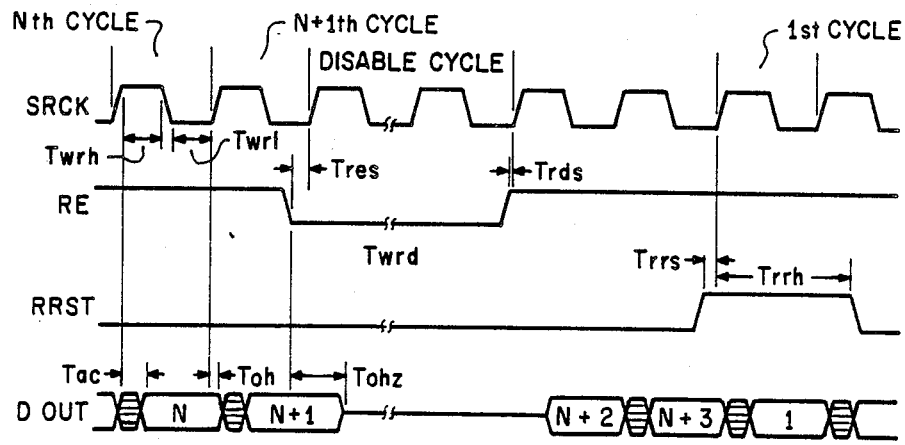
FIG. 5 is a timing chart of signals involved in the read operation of the memory device of FIG. 1.

RRST is an input signal to indicate at the rising edge thereof a return to the beginning address (see FIG. 5).

Data write operation:

(1) First, the input signal WRST is switched from low to high to reset the data write address in the device to zero. Inside the device, the following operational sequence then proceeds. First, the rising edge of signal WRST is detected by a proper circuit to indicate the appearance of such signal to the input line selector. Upon signal reception, this input line selector establishes electrical connection of two lines I/O(A) and IN with the lines I/O(B) and IND electrically disconnected from the line IN. Simultaneously, data transfer gates $T_{GB1}$ and $T_{GB2}$ on the line buffer B which are connected to the line I/O(B) and also data transfer gates $T_{GW1}$ to $T_{GW4}$ on the write line buffer which are connected to the line IND are all turned off. Namely, the pointer B and serial line pointer are reset while the pointer A indicates the address 0. The data transfer gate $T_{GA1}$ is now turned on. Data from the data input buffer is thus transmitted along the lines IN and I/O (A) and written at the address 0 of line buffer A.

(2) Timed by the clock SWCK, data is sequentially written at successive addresses of line buffer A.

(3) As the line buffer A gets full with data written at all the available addresses thereof, a data transmission route switching request is sent from the pointer A to the input line selector, and the input line selector disconnects the line I/O(A) from the line IN and connects the line I/O(A) to the line IND.

(4) Timed by the clock SWCK, the serial write pointer sequentially turns on data transfer gates $T_{GW1}$ through $T_{GW4}$ on the write line buffer to write input data from the $D_{IN}$ in the write line buffer.

(5) The moment the serial write pointer turns on the $T_{GW3}$, a write request signal WRQ is generated and transmitted to the arbiter circuit to write data stored in the first half of write line buffer in the dynamic memory array.

(6) Subsequently, by increasing the address of the row decoder step by step, data can be written sequentially up to the maximum capacity of the DRAM memory array.

If another write reset signal WRST is generated while data being written in the DRAM, this signal is likewise transmitted to the input line selector. This time, however, the line IN is connected to the line I/O(B) while being disconnected from lines I/O(A) and IND. As the line buffer B thus gets full with data written at all the available addresses, an operation similar to the above step (3) disconnects the line IN from the line I/O(B) and reconnects the line I/O(B) to the line IND. Data write thus proceeds as mentioned above.

Upon input of the next write reset signal WRST, the line IN is connected to the line I/O(A). Namely, the two lines I/O(A) and I/O(B) are alternately selected for connection to the line IN as when switched by a toggle switch of the input line selector.

Both line buffers A and B are composed of full-static memory elements. This design is deeply involved in the data read operation, so the reason why that design is selected will be given below in the following description of the data read operation.

Data read operation:

Data read operation will be described below.

(1) The read reset signal RRST is switched from low to high to reset the data read address to zero inside the device. Internally, the edge of signal RRST is detected to indicate the appearance of such signal to the output line selector and arbiter circuit. Upon signal reception, the output line selector connects either the line I/O(A) or the line I/O(B) to the line OUT. For this connection, if one of these lines I/O(A) or I/O(B) is being used for data write, the output line selector selects the other line that is not being used for connection to the line OUT. This insures that if a signal WRST is followed by a signal RRST within a certain time, old data is read. As mentioned later, it is thereby intended that data may be consistently read from the main memory of dynamic type. Alternatively, in case neither the line I/O(A) nor I/O(B) is connected to the line IN, one of these two lines that has been used by the last WRST signal is connected to the line OUT. In this case, new data is to be read. Thereafter, each time the signal RRST appears, the same data will be repeatedly read out until the next WRST signal causes such data to be replaced with new data. It is noted that since the signal RRST is an external signal input from outside by the operator, it cannot be forecast when the RRST signal will appear. For quick response to the signal RRST, a static memory is suitable for use since such a memory type enables rapid reading of data. This is the reason why the static type memory is preferred for the line buffers A and B in the present example. Though the static type memory lowers the degree of circuit integration, the use of such a static type memory as each of the line buffers A and B, each having a memory capacity of around 100 bits, gives a negligibly small effect on the total dimensions of the memory device.

On the other hand, the signal RRST, as it transmitted to the arbiter circuit, generates a read request signal RRQ to read data from the dynamic memory array into the read line buffer so necessary data may be read out in a necessary interval of time. This prepares for the data read after all data has been read out from the line buffer A or the line buffer B that is currently being read.

(2) Timed by the clock SRCK, data is serially read out from the line buffer A or the line buffer B until data is read out up to the last address thereof.

(3) A data transmission route switch request is then transmitted from the pointer A or B to the output line selector to connect the line OUTD to the line OUT.

(4) Since at the conclusion of step (1) of the data read operation, the first half of the read line buffer has already been loaded with data to be read out, data is now continuously read out through the line OUT without any interruption. The moment the read pointer turns on the $T_{GR1}$, another read request RRQ is generated and applied to the arbiter circuit to read necessary data from the dynamic memory array to the second half of read line buffer.

It is noted that same data may be read out repeatedly by repeated input of the signal RRST.

The description of the basic operation is now complete.

On the ideal FIFO memory, data read and write could have been completely independent of each other without any synchronization. Actually, however, the memory device has a limited memory capacity, so some restrictions are inevitably imposed on data read and write.

For easier understanding, an explanation will be given below with reference to an application of the FIFO memory device of the above example to read and write video data. It is assumed that this memory device has a memory capacity that corresponds to a frame of video data. (According to the NTSC system that is the standard system in Japan, a frame of a video screen image is composed of 525 scanning lines, so a frame of video data is composed of video data for such 525 scanning lines.)

As a frame of video data is sequentially written into the memory device from the first data bit to the last data bit thereof, the above memory device gets full. If video data is further continuously written to the memory device when the storage capacity of this memory device has been fully utilized, namely, if data continues to be written even after the first frame is switched to the second frame, data stored in the memory is successively replaced with data of the second frame from the top address. Of course, if the signal WE is set low to prohibit data write of the second and subsequent frames, the first frame of video data is kept stored and the same data can be read out any number of times by repeating the data read procedure.

The above explanation refers to the circuit configuration of FIG. 1. However, some modifications could very readily be provided. For example, when the memory gets full, an internal signal may be generated to advise the operator that the memory is full. Also, data overwrite may be prohibited by creating the same internal state as if the signal WE were set low.

With the memory configuration of FIG. 1, in case data is written continuously as mentioned above, either the preceding frame (old data) or the current frame (new data) that is being written can be read depending on the timing of the RRST signal relative to the last WRST signal. How this timing affects the above frame selection for data read is determined by the memory capacity of the line buffers A and B. For example, if a memory capacity of 100 bits is assumed for each of these line buffers, generation of an RRST signal within 100 SWCK clock cycles after the last WRST signal results in the output of old data.

Generation of an RRST signal at a later time namely, more than 100 SWCK clock cycles after the last WRST signal does however not always insure that new data will be read. This time, data transfer time in the main memory from the write line buffer to the memory array and from the memory array to the read line buffer is involved.

With the memory circuit configuration as described in detail and assuming a memory capacity of 200 bits for both of the write and read line buffers, new data will be read out under the following condition.

First, it is assumed that the first 100 bits of the new frame data are written in the line buffer A and the next 100 bits from the 101th bit through the 200th bit of the new frame data are written in the write line buffer from the address 1 through 100. The moment the 201th bit is written at the address 101 of the write line buffer, a write request WRQ is generated (as already mentioned). Since data transfer to the memory array is always complete before the 301th bit is written, new data will be read satisfactorily if a read request RRQ to request transfer of data 101th bit through 200th bit from the memory array to the read line buffer (resulting in input of an RRST signal as already mentioned) is generated when the 301th bit is written or later.

Namely, new data can be read out assuredly if a signal RRST is generated more than 300 SWCK clock cycles after generation of the last WRST signal (namely, after 300 bits of data have been written).

If a signal RRST should be generated 100 to 300 SWCK clock cycles after generation of the last WRST signal, no determination can be made as to which of the old and new data shall be read. In this time range, therefore, the operator is prohibited from generating any RRST signal.

Since data write and read need not be synchronous, the clock pulse width of SWCK and SRCK can be changed freely, except that to avoid the mixing of old and new data or any other confusion, the clocks SWCK and SRCK must be set to such pulse widths that at any time when the clock SWCK is at the mth cycle after the occurrence of a signal at the 0th cycle of this clock and the clock SRCK is at the nth cycle after the occurrence of an RRST signal at the 0th cycle of the second clock, m and n must satisfy an inequality $m-n \leq 100$ or $m-n \geq 300$.

Besides, the memory circuit of FIG. 1 comprises a DRAM (dynamic RAM) memory and is provided with an internal circuit to refresh the data stored in this memory without control by any external signal. This will be explained below.

The basic design of the memory device includes line buffers for serial-parallel and parallel-serial conversion of data, the memory device further having a ring oscillator or oscillators or a similar oscillator or oscillators, a counter or counters to count oscillation pulses from such oscillators, a mechanism to generate the read and write request signals, a circuit to generate the refresh signal, and an arbiter circuit to determine priority between read, write and refresh signals as these signals are generated depending on circumstances. In the device, for refreshing, the oscillation frequency of an oscillator is divided by a proper counter to repeatedly generate a refresh request signal RFRQ at a proper cycle. As mentioned above, the memory device is so designed that an internal circuit may refresh data stored in the memory device without recourse to any external signal. So an efficient memory device can be provided which is capable of reading and writing data even in the refresh mode without any burden being imposed on the operator by the design of the refresh control circuit.

It will be evident that various modifications can be made to the described embodiments without departing from the scope of the present invention.

For example, the position of the above serial counter, construction of a circuit etc. can be variously modified, and the invention can be applied to another memory device rather than the above memory.

In the invention, as described above, because a counter returns to reset mode when coming up to an arbitrary address and an address or addresses after the arbitrary address are inaccessible, it is possible to get rid of defective bits effectively by not using the defective memory cells in the data storage and/or data propagation procedures carried out by the memory device, thereby reducing the production percentage of defective goods by making use of effective regions of a memory device with one or more defective memory cells rather than scrapping it. Moreover, because a fault tolerant construction can be incorporated into a counter itself without requiring redundant memory cells, the size of a memory chip and its cost will not increase.

What is claimed is:

1. A memory device comprising:
    an array of memory cells arranged in rows and columns;
    counter means operably connected to said array of memory cells and incrementing in a counting sequence in response to the writing and/or reading of data bits to and/or from said array of memory cells;
    said array of memory cells including at least one region thereof containing one or more defective memory cells located in a respective one of said rows and columns of memory cells;
    said counter means being provided with an internal memory limiting circuit disconnecting the address of said respective ones of said rows and columns of memory cells containing a defective memory cell; and
    said counter means having reset circuit means responsive to the disconnection of the address of said respective ones of said rows and columns of memory cells containing a defective memory cell by said internal memory limiting circuit to reset said counter means at the beginning of the counting sequence, whereby said array of memory cells is programmed to employ only rows and columns thereof containing operable memory cells in a data storage and/or data output procedure.

2. A memory device as set forth in claim 1, wherein said counter means comprises:
    a plurality of serially connected frequency dividers;
    a plurality of logic gates respectively corresponding to individual regions of said array of memory cells, each of said logic gates having first and second inputs;

said plurality of frequency dividers corresponding to said plurality of logic gates, each of said frequency dividers having its output connected to a first input of said logic gate corresponding thereto;

the outputs of said plurality of logic gates being connected in common to define a common output line;

a reset feedback line connected to said common output line and to each of said plurality of frequency dividers;

a plurality of fuse elements, each fuse element connecting a respective individual region of said array of memory cells to a second input of the logic gate corresponding thereto;

said internal memory limiting circuit being defined by said plurality of fuse elements and the connection thereof to the second inputs of the respective logic gates corresponding thereto such that disconnection of a particular fuse element from the second input of the logic gate corresponding thereto removes the addresses of a region of said array of memory cells containing one or more defective memory cells from the counting sequence in the writing and/or reading of data being propagated in the memory device; and said reset circuit means being defined by said plurality of logic gates and the connection of said common output line therefrom to said reset feedback line.

3. A memory device as set forth in claim 2, wherein said plurality of logic gates are AND logic circuits; and said plurality of fuse elements are MOSFETS.

4. A memory device as set forth in claim 2, wherein the maximum count number of said plurality of frequency dividers corresponds to the maximum address relating to a region of said array of memory cells in which all memory cells are operable;

all addresses occurring after the maximum address being inaccessible by virtue of a fuse element being disconnected from the second input of the logic gate corresponding thereto;

a logic gate of said plurality of logic gates providing an output on said common output line of said plurality of logic gates in dependence upon the disconnection of said fuse element from the second input thereof; and said output of said logic gate on said common output line being a reset pulse communicated to each of said plurality of frequency dividers via said reset feedback line to reset the count number of said plurality of frequency dividers to the beginning of the counting sequence.

5. A memory device as set forth in claim 2, wherein each of said fuse elements comprises:

a first resistor and a second resistor, said first resistor being of relatively high resistance and said second resistor being of relatively low resistance in comparison to each other;

said first resistor of high resistance and said second resistor of low resistance being connected in series between a power source and ground;

the second input of the corresponding logic gate being connected between said serially connected first and second resistors;

input to the corresponding logic gate via the second input thereof being provided through said second resistor of low resistance connecting said second input of said logic gate to ground when said fuse element is connected to said second input of said logic gate;

input to the corresponding logic gate via the second input thereof being provided through said first resistor of high resistance connecting said second input of said logic gate to the power source when said fuse element is disconnected from said second input of said logic gate to enable said logic gate to provide an output on said common output line; and said output of said logic gate on said common output line being a reset pulse communicated to each of said plurality of frequency dividers via set reset feedback line to reset the count number of said plurality of frequency dividers to the beginning of the counting sequence.

6. A memory device comprising:

a plurality of memory cells arranged for serial propagation of write data bits thereinto and read data bits as output therefrom and defining a memory array having an input and an output;

data input means operably connected to said input of said memory array for selectively providing input data as write data in response to a data input control signal received by said data input means;

data output means operably connected to said output of said memory array for selectively providing output data as readout data received from the output of said memory array in response to a data read out signal received by said data output means;

serial write counter means operably interposed between said data input means and said plurality of memory cells at said input of said memory array and incrementing in a counting sequence in response to the serial writing of data bits into successive ones of said plurality of memory cells;

serial counter means operably interposed between said data output means and said plurality of memory cells at said output of said memory array and incrementing in a counting sequence in response to the serial read out of data bits from successive ones of said plurality of memory cells;

said serial write counter means being provided with a first internal memory limiting circuit disconnecting respective addresses corresponding to portions of said plurality of memory cells in which at least one defective memory cell occurs;

said serial read counter means being provided with a second internal memory limiting circuit disconnecting said respective addresses corresponding to the portions of said plurality of memory cells in which said at least one defective memory cell occurs;

the remainder of said memory array, excluding the portions of said plurality of memory cells in which said at least one defective memory cell occurs, containing only operable memory cells;

said serial write counter means having a first reset circuit responsive to the disconnecting of respective addresses corresponding to the portions of said plurality of memory cells in which said at least one defective memory cell occurs by said first internal memory limiting circuit to reset said serial write counter means at the beginning of the counting sequence; and said serial read counter means having a second reset circuit responsive to the disconnecting of respective addresses corresponding to the portions of said plurality of memory cells in which said at least one defective memory cell occurs by said second internal memory limiting circuit to reset said serial read counter means at the beginning of the counting sequence, whereby said memory array is programmed to employ only said remainder thereof containing only operable memory cells in a data storage and/or data output procedure.

7. A memory device as set forth in claim 6, wherein said memory array is a dynamic memory array in which said plurality of memory cells are dynamic memory cells arranged in rows and columns for said serial propagation of write data bits thereinto and read data bits as output therefrom in a FIFO data operation.

* * * * *